United States Patent [19]

Palmour et al.

[11] Patent Number: 4,946,547

[45] Date of Patent: Aug. 7, 1990

[54] METHOD OF PREPARING SILICON CARBIDE SURFACES FOR CRYSTAL GROWTH

[75] Inventors: John W. Palmour; Hua-Shuang Kong, both of Raleigh; John A. Edmond, Apex, all of N.C.

[73] Assignee: Cree Research, Inc., Durham, N.C.

[21] Appl. No.: 421,375

[22] Filed: Oct. 13, 1989

[51] Int. Cl.$^5$ .................. H01L 2/306; B44C 1/22; C03C 15/00; C03C 25/06

[52] U.S. Cl. ................... 156/643; 156/612; 156/645; 156/646; 156/662; 156/DIG. 111; 204/192.37; 252/79.1; 427/38; 427/309; 437/100; 437/234

[58] Field of Search ............... 156/610, 612, 613, 614, 156/636, 643, 645, 646, 662, DIG. 111; 427/38, 39, 309; 204/192.23, 192.3, 192.32, 192.37; 437/100, 234; 252/79.1

[56] References Cited

U.S. PATENT DOCUMENTS

| | | | |
|---|---|---|---|
| H28 | 2/1986 | Addamiano | 156/612 |
| 3,078,219 | 2/1963 | Chang | 204/143 |
| 3,398,033 | 8/1968 | Haga et al. | 156/662 |
| 3,421,956 | 1/1969 | Ebert et al. | 156/662 |
| 3,501,356 | 3/1970 | Chu | 148/175 |
| 3,504,181 | 3/1970 | Chang et al. | 250/83.3 |
| 3,563,817 | 2/1971 | Chang et al. | 148/187 |
| 4,032,960 | 6/1977 | Anthony et al. | 357/51 |
| 4,082,572 | 4/1978 | Anthony et al. | 148/1.5 |
| 4,226,665 | 10/1980 | Mogab | 156/643 |
| 4,393,967 | 7/1983 | Cuomo et al. | 192/84 |
| 4,595,453 | 6/1986 | Yamazaki et al. | 156/643 |
| 4,676,868 | 6/1987 | Riley et al. | 156/643 |
| 4,735,920 | 4/1988 | Stephani et al. | 437/234 |
| 4,757,028 | 7/1988 | Kondoh et al. | 437/40 |
| 4,762,806 | 8/1988 | Suzuki et al. | 437/100 |
| 4,865,685 | 9/1989 | Palmour | 156/643 |

OTHER PUBLICATIONS

Brander and Boughey; The etching of α-silicon carbide; Brit. J. Appl., 1967, vol. 18, 905.

E. Biedermann; Selectively Etching Semiconductor Material; IBM Technical Disclosure Bulletin; vol. 9, No. 2, Jul. 1966, 213.

Palmour, Williams, Astell-Burt and Davis; Crystallographic Etching Phenomenon during Plasma Etching of SiC (100) Thin Films in SF$_6$; J. Electrochem. Soc. vol. 136, No. 2, Feb. 1989; 491.

Kelner, Binari, and Klein; Plasma Etching of β-SiC; J. Electrochem. Soc.; Solid-State Science and Tech.; Jan. 1987; vol. 134, No. 1; 253.

Palmour and Davis; Dry etching of β-SiC in CF$_4$ and CF$_4$+O$_2$ mixtures; J. Vac. Sci. Technol. A 4(3), May/Jun. 1986; 590.

Edmond, Palmour and Davis; Chemical Etching of Ion Implanted Amorphous Silicon Carbide; J. electrochem. Soc.; Mar. 1986; vol. 133, No. 3; 651.

Sugiura, Lu, Cadien and Steckl; Reactive ion etching of SiC thin films using fluorinated gases; J. Vac. Sci. Technol. B 4(1), Jan./Feb. 1986; 349.

Dohmae, Shibahara, Nishino and Matsunami; Plasma Etching of CVD Grown Cubis SiC Single Crystals; Japanese Journal of Appl. Phy. vol. 24, No. 11, Nov. 1985; L873.

Matsui, Mizuki, Yamato, Artiome and Namba; Reactive Ion-Beam Etching of Silicon Carbide; Japanese Journal of Appl. Phy. vol. 20, No. 1, Jan., 1981 L38.

Münch and Pfaffeneder; Thermal oxidation and Electrolytic Etching of Silicon Carbide; 642.

Primary Examiner—William A. Powell
Attorney, Agent, or Firm—Bell, Seltzer, Park & Gibson

[57] ABSTRACT

The invention is a method of forming a substantially planar surface on a monocrystalline silicon carbide crystal by exposing the substantially planar surface to an etching plasma until any surface or subsurface damage caused by any mechanical preparation of the surface is substantially removed. The etch is limited, however, to a time period less than that over which the plasma etch will develop new defects in the surface or aggravate existing ones, and while using a plasma gas and electrode system that do not themselves aggravate or cause substantial defects in the surface.

25 Claims, No Drawings

METHOD OF PREPARING SILICON CARBIDE SURFACES FOR CRYSTAL GROWTH

FIELD OF THE INVENTION

The present invention relates to the preparation of silicon carbide surfaces for crystal growth thereon. This application is related to one of the inventor's prior applications, Ser. No. 07/116,467, filed Nov. 3, 1987, and now U.S. Pat. No. 4,865,685. In particular, the invention relates to a method of dry etching of silicon carbide surfaces following which a silicon carbide thin film is homoepitaxially deposited thereon.

BACKGROUND OF THE INVENTION

In the manufacture of semiconductor devices, one of the most important and fundamental requirements of such devices is that they be formed from precursor materials which have particular properties. In many applications, the appropriate precursor is a single crystal (sometimes referred to as "monocrystalline") material. As is known to those familiar with electronic devices, if the growth and processing of a crystal are not carefully controlled, defects will occur in the crystal which will substantially affect the electronic properties of the crystal and of any resulting device made from it. In many cases defective crystals render such devices inoperable.

One of the distinguishing features of crystals is their internal order. This internal order includes a regular repetition of a structural pattern of species (e.g. atoms, ions or molecules) usually in three dimensions. This regular repetition extends not only to the immediate environment of each particular atom, ion or molecule, but also through large distances representing millions of repetitions of the basic structural pattern.

One disadvantage of such repetition in the crystal structure, however, is that whenever a defect occurs in the crystal structure, the nature of crystal growth is such that the defect in the crystal will likewise be repeated over and over again as the crystal grows. These defects are often called dislocations and such structural imperfections typically extend for distances of hundreds of Angstroms. Typical types of dislocations are referred to as screw dislocations, edge dislocations, stacking faults, antiphase boundaries, and double positioning boundaries. These defects can be severe enough to appear as visible nonuniformity in the surface morphology of the crystal. Additionally, in a material such as silicon carbide that can form in a large number of polytypes separated by small thermodynamic differences, such defects encourage the undesirable nucleation of polytypes other than the polytype of the base crystal.

Various negative electrical effects typically result from such defects and dislocations. The most serious electrical effect is the appearance of undesirable or unacceptable amounts of leakage current in many types of devices. Another effect is lowered electron mobility resulting from scattering collisions in defective crystals. In turn, the lowered electron mobility exhibits itself as an increased resistance in the particular device. In optical devices such as light emitting diodes, crystal defects cause changes in the emitted wavelength and encourage unacceptably broad bandwidths in the emissions.

One crystal growth technique which is desirable in the manufacture of certain semiconductor devices and necessary in the manufacture of others is the growth of thin films of a monocrystalline semiconductor material upon another surface of the same or another semiconductor material, or even upon a non-semiconducting substrate. Such growth is usually accomplished by techniques such as liquid phase epitaxy or chemical vapor deposition and those of ordinary skill in the semiconductor arts are generally familiar with them. These processes generally proceed as a careful building up of a thin film or "epitaxial" layer of new crystalline material upon the existing material. The nature of crystal growth processes are such that defects in the surface upon which the new crystalline material is to be deposited will tend to be faithfully repeated in the new crystalline material which grows upon it. Because the epitaxial layers are typically those portions of the semiconductor material that are used to form and operate the desired electronic devices, these repeated defects can make the resulting crystal less desirable or even nonfunctional from an electronic standpoint.

There thus exits the need to properly prepare surfaces upon which epitaxial crystal growth can take place while minimizing or substantially eliminating defects during the production of semiconductor material for electronic devices.

The problem with all surface preparation techniques, however, is that of attempting to remove existing damage or defects from the surface without causing further damage in the attempt. In this regard, those familiar with the preparation of semiconductor surfaces will recognize that a typical technique includes producing a bulk crystal, sawing or slicing the crystal into smaller crystals or wafers, lapping the crystal by using an abrasive paste in conjunction with a hard surface to quickly remove a fairly large amount of material, and polishing the crystal surface by using a similar paste, but in a milder fashion and with a softer surface to produce a finished surface of semiconductor material. In each case, these steps form "damage nucleated defects" which are reproduced during the epitaxial growth process.

In the case of polishing silicon (Si) wafers, damage-nucleated defects can be easily removed in a final polishing step by using a "polishing etch." Such a step uses a very fine abrasive in a polishing medium that also chemically etches the Si surface as it is being polished. The resulting surface is both smooth and substantially free of damage. Typical polishing etches for Si use a suspension of $SiO_2$ particles in a basic solution (NaOH or KOH) that oxidizes the Si surface. This oxide is in turn mechanically removed by the $SiO_2$ particles.

As set forth in U.S. Pat. No. 4,865,685, interest has recently been rekindled in the use of silicon carbide (SiC) as a semiconductor material. Silicon carbide has long been recognized as having certain favorable characteristics as a semiconductor material. These include a wide band gap, a high thermal conductivity, a high saturated electron drift velocity, and a high electron mobility. As obstacles to its commercialization, however, silicon carbide requires high process temperatures for otherwise ordinary techniques, good starting materials are difficult to obtain, certain doping techniques have traditionally been difficult to accomplish, and perhaps most importantly, silicon carbide crystallizes in over 150 polytypes, many of which are separated by very small thermodynamic differences. Nevertheless, recent advances, including those discussed in U.S. Pat. Nos. 4,865,685 and 4,866,005 have made it possible to produce silicon carbide and silicon carbide based devices on a commercial basis and scale.

In accomplishing epitaxial growth of silicon carbide, however, it has been found that the usual techniques of slicing, lapping and polishing silicon carbide surfaces followed by chemical vapor deposition (CVD) produces a number of apparent defects including stacking faults and the like. These apparently result from subsurface damage caused by these mechanical preparation steps, and that the follow-up steps such as fine polishing, wet etching and oxidation do not repair. These in turn lead to the repetitive defects as the epitaxial layer is grown upon the surface.

Additionally, preparation steps that are suitable for materials such as silicon are not analogously suitable for silicon carbide. As stated earlier, silicon surface preparation uses a chemical polish that slightly etches the silicon chemically, as well as physically. Silicon carbide is, however, much more chemically stable—and thus nonreactive—than silicon and no suitable analogous chemical polish is presently known or used with silicon carbide. As a result, different techniques are used with silicon carbide.

One technique for removing remaining defects from SiC surfaces a liquid or "wet" etch using molten salt materials such as potassium hydroxide (KOH). Molten salt etches are hard to control, however, require generally high temperatures (e.g. 700° C.–800 ° C.) and tend to be chemically aggressive and hard to control.

Another attempted solution includes anodic etching, in which the sample to be etched is used as the anode in an electrolytic circuit using relatively concentrated potassium hydroxide (e.g. 20% aqueous KOH), chromic acid, or oxalic acid as the electrolyte. This has the disadvantage, however, that under any given set of conditions, p and n type material will etch at significantly different rates. Additionally, anodic etching is a low volume process which is often commercially unsuitable, and electrolytic plating also becomes a problem under certain conditions.

An additional technique of SiC surface preparation is oxidation of a surface followed by removal of the oxidized portion. Oxidation techniques, however, have numerous problems including the failure to remove enough material at a viable rate. For example, it can take up to a week of oxidation growth and removal to remove one micron of certain types of materials. Oxidation techniques can also result in dopant re-distribution effects, and oxidationinduced stacking faults.

Accordingly, there exists a need for a method of preparing silicon carbide surfaces for further crystal growth, particularly epitaxial growth, that removes the damage caused by the necessary cutting and polishing steps, while avoiding introducing additional defects that result from the preparation step itself.

OBJECT AND SUMMARY OF THE INVENTION

It is thus an object of the present invention to provide a method of epitaxially growing a monocrystalline silicon carbide thin film on a silicon carbide surface that reduces defect density in the resulting thin film and in the interface between the thin film and the silicon carbide surface. The invention accomplishes this object by the method of forming a substantially planar surface on a monocrystalline silicon carbide crystal, exposing the substantially planar surface to an etching plasma until any surface or subsurface damage caused by the mechanical preparation is substantially removed. The etch is limited, however, to a time period less than that over which the plasma etch will develop new defects in the surface or aggravate existing ones, and while using a plasma gas and electrode system that do not themselves aggravate or cause substantial defects in the surface.

The foregoing and other objects, advantages and features of the invention, and the manner in which the same are accomplished, will become more readily apparent upon consideration of the following detailed description of the invention.

DETAILED DESCRIPTION OF THE PREFERRED EMBODIMENT

The present invention is a method of epitaxially growing a monocrystalline silicon carbide thin film on a silicon carbide surface in a manner that reduces defect density in the resulting thin film and in the interface between the thin film and the silicon carbide surface.

The method first comprises forming a substantially planar surface on a monocrystalline silicon carbide crystal. In the preferred embodiments of the invention, this step comprises mechanically preparing the silicon carbide crystal to form the substantially planar surface. In a common technique, a bulk crystal of silicon carbide is cut, usually by sawing or dicing, to expose a particular planar surface. As discussed later herein, this surface is often specifically selected with respect to the Miller indices of the crystal to enhance further growth. In a typical embodiment, the step of mechanically preparing the crystal comprises slicing the silicon carbide crystal to expose the generally planar surface and then lapping the generally planar surface with an abrasive paste. As stated earlier, the term "lapping" refers to the use of an abrasive paste such as a diamond paste and another hard surface to grind the silicon carbide surface.

Following the lapping step, the surface is typically polished using a milder abrasive and a softer polishing instrument. As stated earlier, in prior crystal growth techniques, the polishing step would sometimes represent the last step prior to commencing epitaxial growth.

Following its initial mechanical preparation, the substantially planar surface is exposed to an etching plasma until any surface or subsurface damage caused by the mechanical preparation is substantially removed. Although applicants do not wish to be bound by any particular theory, it appears from earlier work with silicon carbide, that typical lapping and polishing steps cause subsurface damage even while mechanically improving the exposed planar surface. This subsurface damage appears to provide nucleation sights for crystal defects in thin films grown upon that surface. The removal of silicon carbide material using the etching plasma apparently helps eliminate this subsurface damage as well as the more obvious surface damage.

The etching plasma step is limited, however, to a time period less than that over which the plasma etch itself will develop new defects in the surface or aggravate existing ones, it being understood that the usual purpose of etching techniques is to remove material in a rather substantive fashion and that using it for preparing a planar surface as in the present invention requires a more considered technique. As general guidelines an etching process that proceeds for too long of a time period will encourage the "micromasking" effects discussed later herein. Similarly, an etching process that is permitted to extend to a greater than necessary depth may tend to expose additional existing defects that will reproduce themselves during the later epitaxial growth steps. Accordingly, because at least 200 angstroms of material must typically be removed in order to remove any damage, etch depths of between about 0.02 and 10 microns (1 micron equals 10,000 angstroms) are presently preferred, with etch depths of between about 0.5 and 1 micron most preferred.

Additionally, the method of the invention includes a plasma gas and electrode system that do not themselves cause substantial defects in the surface.

As discussed more fully later herein, the last step is that of depositing a thin film of monocrystalline silicon carbide upon the etched surface by chemical vapor deposition.

As set forth in the inventor's U.S. Pat. No. 4,865,685 referred to earlier, the etching step must be carried out in a particular fashion in order to preserve the advantages of the invention. In general, the step of using an etching plasma gas and electrode system that do not themselves cause substantial defects in the surface comprises applying a plasma generating potential across two electrodes and generating a plasma by introducing a gas between them. The gas is selected as being easily disassociated substantially into its elemental species in the plasma and so that all of the disassociated species from the gas are volatile in the plasma and so that at least one of the disassociated species is reactive with silicon carbide. The selection of the gas according to this criteria is important because gases such as tetrafluoromethane ($CF_4$), although reactive with silicon carbide under plasma conditions, tend to produce fluorocarbon radicals. These in turn often tend to deposit onto the surface being etched in the form of fluorocarbon compounds or even polymers. Thus, a gas must be selected which both reacts with silicon carbide and for which the dissociated species remain volatile rather than forming compounds which deposit on the surface.

Accordingly, in one preferred embodiment of the invention, the reactive ion plasma is formed from nitrogen trifluoride ($NF_3$), while in another preferred embodiment, the gas is a mixture of about 10% nitrous oxide ($N_2O$) in nitrogen trifluoride. Alternatively, other mixtures of fluorine containing gases and oxygen containing gases can be used so long as they meet the requirement of being dissociated substantially into elemental species in the plasma and wherein substantially all of the dissociated species remain volatile in the plasma and wherein at least one of the dissociated species is reactive with silicon carbide, with the proviso that none of the resulting species otherwise interferes with the etching process or the surface being prepared.

Similarly, in a preferred embodiment of the method, the step of generating a reactive ion plasma comprises applying a direct current bias to the plasma, and if desired, the method can further comprise the step of applying a magnetic field to the target to enhance the etch rate of the silicon carbide target in the plasma. In such a case, the step of applying the magnetic field preferably comprises placing a magnet adjacent the silicon carbide target.

It will also be understood by those familiar with plasma techniques that any other appropriate manner of generating and sustaining the plasma can be used in accordance with the present invention. Such other techniques include, but are not limited to, reactive ion beam plasmas and electron cyclotron resonance (ECR) plasmas. ECR plasmas are particularly suitable for obtaining a uniform plasma at lower pressures.

As another consideration in the etching process, the material from which the electrodes are formed must be carefully addressed. As discussed in U.S. Pat. No. 4,865,658, observation of the results of otherwise analogous etching processes in which an anodized aluminum cathode has been used as the target indicates that during such etching processes aluminum oxide ($Al_2O_3$) sputters from the cathode onto the surface being etched. These small deposits of metal or metal oxide "micromask" the surface so that further etching takes place in uneven fashion. As further discussed in this patent, the use of a stainless steel cathode appears to similarly sputter iron and iron compounds onto the surface. Additionally, materials such as aluminum can undesirably react with fluorine in the plasma to produce additional fluorine-containing species which also undesirably accumulate on the etched surface. Therefore, in order to eliminate the surface deposition of both fluorine and $Al_2O_3$, in a preferred embodiment of the invention a carbon cathode cover plate is placed in the etching chamber. Carbon has a number of advantages in the method of the present invention; in particular it has a very low sputter yield. Additionally, carbon in the cathode will react with fluorine species in the plasma which keeps them from accumulating on the etched silicon carbide surface.

Another preferred cover plate material is quartz ($SiO_2$). When a quartz cover plate is used, the only etch products that can form are $SiF_x$ (where x is 1 to 4), SiO and $O_2$. All of these species are volatile in the plasma, do not build up in the reaction chamber, and do not form micromasking species. Additionally, quartz shares certain advantages with carbon such as low sputter yield and harmless deposition on silicon carbide. In particular, if $SiO_2$ is sputtered onto the silicon carbide surface, it will be removed by the etch much more rapidly than will the silicon carbide and thus have no demonstrative affect.

Thus, the invention comprises positioning the substantially planar silicon carbide surface as a target on one of the electrodes which is formed from the material with the low sputter yield and for which the electrode material is reactive with the dissociated species. The plasma reacts with the silicon carbide to thereby etch the silicon carbide while the reaction of the dissociated species with the electrode and the electrode's low sputter yield prevent contamination of the target with either sputtered materials from the supporting electrode or nonvolatile species from the plasma.

The general techniques for reactive ion etching are known to those familiar with this art and specific techniques can be found and adjusted without undue experimentation. A number of specific parameters for use with silicon carbide are set forth in U.S. Pat. No. 4,865,658 as well. In the preferred embodiments of the present invention the step of applying the plasma generating potential comprises applying between about 10 and 400 watts of power to the electrodes. Stated differently, a power density of between about 0.04 and 2 watts per square centimeter are applied to the powered electrode in these embodiments. In the most preferred embodiment, a power density of between about 0.4 and 0.9 watts per square centimeter is applied to the powered electrode.

The gas is typically introduced at a pressure of between about 5 and 5000 milliTorr and at a flow rate of between about 1 and 500 standard cubic centimeters per minute (sccm) with a flow of about 50 sccm most preferred. In a most preferred embodiment, the step of introducing a gas comprises introducing a mixture of about 10% nitrous oxide in 50 sccm of nitrogen trifluoride at a pressure of about 100 milliTorr with about 100 watts of power to the electrodes at a DC bias of about 130 volts, and using the quartz cover plate on the target electrode. Under such conditions, removal of material will begin in about 9 seconds, and can continue for 75 minutes or more depending upon the amount of material to be removed. A typical etch will remove about 0.5 microns in about 3.7 minutes under these conditions. A 75 minute etch will similarly remove about 10 microns under these conditions.

Finally, the method of the invention comprises depositing a thin film of monocrystalline silicon carbide upon the etched surface by chemical vapor deposition. In preferred embodiments, this comprises depositing a thin film of either 6H ("alpha") or 3C ("beta") silicon carbide on an alpha silicon carbide surface.

Where the thin film layer to be deposited is 6H silicon carbide, the method comprises depositing a thin film layer of 6H silicon carbide on a flat interface 6H silicon carbide surface that is inclined more than one degree off axis with respect to a basal plane thereof substantially towards one of the <1120> directions. A good background discussion of aspects of this technique is set forth in U.S. Pat. No. 4,912,064, "Homoepitaxial Growth of Alpha-SiC Thin Films and Semiconductor Devices Fabricated Thereon."

Where a thin film of beta silicon carbide is to be deposited, the step of depositing the thin film comprises epitaxially depositing a beta silicon carbide thin film in the [111] growth direction on the (0001) Si face of a 6H silicon carbide surface such that the (111) crystallography of the beta silicon carbide thin film matches the (0001) crystallography of the 6H silicon carbide surface and such that the beta silicon carbide (101) face is parallel to the 6H silicon carbide (1120) face and the beta silicon carbide (111) face is parallel to the 6H silicon carbide (0001) face. A further background description of such techniques is set forth in co-pending application Ser. No. 07/113,921 filed Oct. 26, 1987, now U.S. Pat. No. 4,912,063, for "Growth of Beta-SiC Thin Films and Semiconductor Devices Fabricated Thereon."

In the specification, there have been disclosed typical preferred embodiments of the invention and, although specific terms have been employed, they have been used in a generic and descriptive sense only and not purposes of limitation, the scope of the invention being set forth in the following claims.

That which is claimed:

1. A method of epitaxially growing a monocrystalline silicon carbide thin film on a silicon carbide surface that reduces defect density in the resulting thin film and in the interface between the thin film and the silicon carbide surface, the method comprising:
    forming a substantially planar surface on a monocrystalline silicon carbide crystal;
    exposing the substantially planar surface to an etching plasma until any surface or subsurface damage caused by the mechanical preparation is substantially removed, but for a time period less than that over which the plasma etch will develop new defects in the surface or aggravate existing ones, and while using a plasma gas and electrode system that do not themselves cause substantial defects in the surface; and
    depositing a thin film of monocrystalline silicon carbide upon the etched surface by chemical vapor deposition.

2. A method according to claim 1 wherein the step of forming a substantially planar surface on a silicon carbide crystal comprises mechanically preparing the silicon carbide crystal to form a substantially planar surface.

3. A method according to claim 2 wherein the step of mechanically preparing a silicon carbide crystal comprises:
    slicing a silicon carbide crystal to expose a generally planar surface;
    lapping the generally planar surface with an abrasive paste; and
    polishing the generally planar surface with an abrasive paste to produce a substantially planar surface.

4. A method according to claim 1 wherein the step of exposing the substantially planar surface to an etching plasma for a time period less than that over which the plasma etch will develop new defects in the surface or aggravate existing ones comprises limiting the depth of etch to between about 0.02 and 10 microns.

5. A method according to claim 1 wherein the step of exposing the substantially planar surface to an etching plasma for a time period less than that over which the plasma etch will develop new defects in the surface or aggravate existing ones comprises limiting the depth of etch to between about 0.5 and 1 micron.

6. A method according to claim 1 wherein the step of depositing a thin film of monocrystalline silicon carbide upon the etched surface by chemical vapor deposition comprises depositing a thin film layer of 6H silicon carbide on a flat interface 6H silicon carbide surface that is inclined more than one degree off axis with respect to a basal plane thereof substantially towards one of the <1120> directions.

7. A method according to claim 1 wherein the step of depositing a thin film of monocrystalline silicon carbide upon the etched surface by chemical vapor deposition comprises epitaxially depositing a beta silicon carbide thin film in the [111] growth direction on the (0001) Si face of a 6H silicon carbide surface such that the (111) crystallography of the beta silicon carbide thin film matches the (0001) crystallography of the 6H silicon carbide surface and such that the beta silicon carbide (101) face is parallel to the 6H silicon carbide (1120) face and the beta silicon carbide (111) face is parallel to the 6H silicon carbide (0001) face.

8. A method according to claim 1 wherein the step of exposing the substantially planar surface to an etching plasma while using a plasma gas and electrode system that do not themselves cause substantial defects in the surface comprises:
    applying a plasma generating potential across two electrodes;
    generating a plasma between the two electrodes by introducing a gas between the electrodes, and wherein the gas is easily dissociated substantially into its elemental species in the plasma and wherein substantially all of the dissociated species from the gas are volatile in the plasma and wherein at least one of the dissociated species is reactive with silicon carbide;
    positioning the substantially planar silicon carbide surface as a target on one of the electrodes, and wherein the electrode is formed from a material with a low sputter yield and wherein the electrode material is reactive with the dissociated species; and reacting the plasma with the silicon carbide to thereby etch the silicon carbide while the reaction of the dissociated species with the electrode and the electrode's low sputter yield prevents contamination of the target with either sputtered materials from the supporting electrode or nonvolatile dissociated species from the plasma.

9. A method according to claim 8 wherein the step of generating a plasma between the two electrodes by introducing a gas between the electrodes comprises introducing a mixture of a fluorine containing gas and an oxygen containing gas that is easily dissociated substantially into its elemental species in the plasma and wherein substantially all of the dissociated species from the gas mixture are volatile in the plasma and wherein at least one of the dissociated species is reactive with silicon carbide and with the proviso that none of the resulting species otherwise interferes with the etching process or the silicon carbide surface being prepared.

10. A method according to claim 8 wherein the step of generating a plasma comprises forming a reactive ion plasma from nitrogen trifluoride.

11. A method according to claim 10 wherein the step of generating a reactive ion plasma comprises applying a direct current bias to the plasma.

12. A method according to claim 8 further comprising the step of applying a magnetic field to the target to enhance the etch rate of the silicon carbide target in the plasma.

13. A method according to claim 12 wherein the step of applying a magnetic field comprises placing a magnet adjacent the silicon carbide target.

14. A method according to claim 8 wherein the step of positioning the silicon carbide target on one of the electrodes comprises positioning the silicon carbide target on a carbon cathode.

15. A method according to claim 8 wherein the step of positioning the silicon carbide target on one of the electrodes comprises positioning the silicon carbide target on a quartz cathode.

16. A method according to claim 8 wherein the step of applying a plasma generating potential comprises applying between about 10 and about 400 watts of power to the electrodes.

17. A method according to claim 8 wherein the step of applying a plasma generating potential comprises applying a power density of between about 0.04 and about 2 watts per square centimeter to the powered electrode.

18. A method according to claim 8 wherein the step of applying a plasma generating potential comprises applying a power density of between about 0.4 and 0.9 watts per square centimeter to the powered electrode.

19. A method according to claim 8 wherein the step of introducing a gas between the electrodes comprises introducing the gas at a pressure of between about 5 and 5000 milliTorr.

20. A method according to claim 8 wherein the step of introducing a gas comprises introducing a gas at a flow rate of between about 1 and about 500 standard cubic centimeters per minute.

21. A method according to claim 8 wherein the step of introducing a gas comprises introducing a gas at a flow rate of about 50 standard cubic centimeters per minute.

22. A method according to claim 8 wherein the step of introducing a gas comprises introducing a mixture of about ten percent nitrous oxide in nitrogen trifluoride at a pressure of about 100 milliTorr.

23. A method according to claim 8 wherein the step of generating a plasma comprises generating a reactive ion beam plasma.

24. A method according to claim 8 wherein the step of generating a plasma comprises generating a electron cyclotron resonance plasma.

25. A method of etching of a silicon carbide target comprising:

applying a plasma generating potential across an anode and a quartz cathode;

generating a plasma between the anode and the quartz cathode by introducing a mixture of about ten percent nitrous oxide in nitrogen trifluoride therebetween;

positioning a silicon carbide target to be etched on the quartz cathode whereby the quartz cathode exhibits a low sputter yield and is reactive with dissociated fluorine from the nitrogen trifluoride; and reacting the plasma with the silicon carbide until any surface or subsurface damage caused by the mechanical preparation is substantially removed, but for a time period less than that over which the plasma etch will develop new defects in the surface or aggravate existing ones, to thereby etch the silicon carbide while the reaction of dissociating fluorine with the quartz cathode, and the cathode's low sputter yield prevents contamination of the target with either sputtered materials from the cathode or polymerized fluorine species from the plasma.

* * * * *